(12) United States Patent
Elsewefy et al.

(10) Patent No.: US 11,687,695 B2
(45) Date of Patent: Jun. 27, 2023

(54) SHADOW FEATURE-BASED DETERMINATION OF CAPACITANCE VALUES FOR INTEGRATED CIRCUIT (IC) LAYOUTS

(71) Applicant: Siemens Industry Software Inc., Plano, TX (US)

(72) Inventors: Omar Elsewefy, Giza (EG); Hazem Hegazy, Cairo (EG)

(73) Assignee: Siemens Industry Software Inc., Plano, TX (US)

( * ) Notice: Subject to any disclaimer, the term of this patent is extended or adjusted under 35 U.S.C. 154(b) by 0 days.

(21) Appl. No.: 17/218,694

(22) Filed: Mar. 31, 2021

(65) Prior Publication Data
US 2022/0318479 A1 Oct. 6, 2022

(51) Int. Cl.
*G06F 30/398* (2020.01)
*G06F 30/27* (2020.01)
*G01R 31/28* (2006.01)
*G06F 30/392* (2020.01)
*G01R 27/26* (2006.01)
*G06F 30/337* (2020.01)

(52) U.S. Cl.
CPC ....... *G06F 30/398* (2020.01); *G01R 27/2605* (2013.01); *G01R 31/2851* (2013.01); *G06F 30/27* (2020.01); *G06F 30/337* (2020.01); *G06F 30/392* (2020.01)

(58) Field of Classification Search
CPC ...... G06F 30/398; G06F 30/27; G06F 30/337; G06F 30/392; G01R 27/2605; G01R 31/2851; G01R 31/287
See application file for complete search history.

(56) References Cited

U.S. PATENT DOCUMENTS

| | | | |
|---|---|---|---|
| 6,735,748 B1 * | 5/2004 | Teig | G06N 7/005 716/115 |
| 6,883,148 B1 * | 4/2005 | Teig | G06F 30/367 706/920 |
| 7,051,293 B1 * | 5/2006 | Teig | G06F 30/398 716/113 |
| 7,260,797 B2 * | 8/2007 | Batterywala | G06F 30/398 703/2 |

(Continued)

OTHER PUBLICATIONS

"Layout Capacitance Extraction Using Automatic Pre-Chacrterization and Machine Learning", by Zhixing Li and Weiping Shi, @ 2020.*

*Primary Examiner* — Nha T Nguyen

(57) ABSTRACT

A computing system may include a shadow feature model training engine configured to access a set of integrated circuit (IC) layouts and capacitance values determined for components of the set of IC layouts. The shadow feature model training engine may construct shadow feature training data for the set of IC layouts, including by extracting shadow features for components of the set of IC layouts, combine extracted shadow features and determined capacitance values to form the shadow feature training data, and may further train a machine-learning (ML) model with the shadow feature training data. The computing system may also include a shadow feature application engine configured to extract shadow features for components of an input IC layout and determine capacitance values for the input IC layout via the trained ML model.

13 Claims, 10 Drawing Sheets

(56) References Cited

U.S. PATENT DOCUMENTS

| | | | | |
|---|---|---|---|---|
| 8,122,419 B2* | 2/2012 | Elfadel | ................ | G06F 30/367 |
| | | | | 716/129 |
| 8,856,710 B2* | 10/2014 | Yeh | ...................... | G06F 30/367 |
| | | | | 716/136 |
| 9,053,259 B1* | 6/2015 | Gennari | ................ | G06F 30/398 |
| 9,104,835 B2* | 8/2015 | Yeh | ...................... | G06F 30/398 |
| 9,519,732 B1* | 12/2016 | Gennari | ................ | G06F 30/398 |

* cited by examiner

SHADOW FEATURE-BASED DETERMINATION OF CAPACITANCE VALUES FOR INTEGRATED CIRCUIT (IC) LAYOUTS

BACKGROUND

Electronic circuits, such as integrated circuits, are used in nearly every facet of modern society, from automobiles to microwaves to personal computers. Design of circuits may involve many steps, known as a "design flow." The particular steps of a design flow are often dependent upon the type of microcircuit being designed, its complexity, the design team, and the circuit fabricator or foundry that will manufacture the circuit. Electronic design automation (EDA) applications support the design and verification of circuits prior to fabrication. EDA applications may implement various EDA procedures, e.g., functions, tools, or features to analyze, test, or verify a circuit design at various stages of the design flow.

BRIEF DESCRIPTION OF THE DRAWINGS

Certain examples are described in the following detailed description and in reference to the drawings.

DETAILED DESCRIPTION

Figure 1:
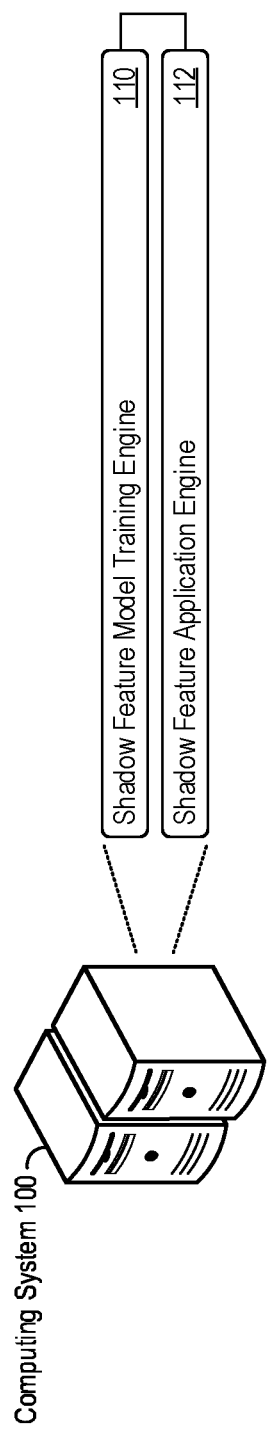
FIG. 1 shows an example of a computing system that supports shadow feature-based determination of capacitance values for integrated circuit (IC) layouts.

Modern circuit designs continue to increase in complexity, and transistor counts numbering in the billions, tens of billions, and more can occur in modern IC designs. With such design complexity, appropriate analysis and verification of circuit designs may be necessary to ensure that IC reliability, functionality, and performance requirements are satisfied. Capacitance determinations (e.g., parasitic capacitance extraction) may be one form of verification that modern IC design flows address. Undesired capacitive coupling can occur for components of an IC design in close proximity to one another forming intrinsic (and typically undesired) capacitors that adversely affect circuit functionality. Such capacitive coupling may be referred to as parasitic capacitance, which design flows may seek to identify, extract, or otherwise address in circuit designs. As part of parasitic extraction processes in modern IC design flows, determination of capacitance values for components of an IC design may be required in order to address and extract such unwanted capacitance values from the circuit design.

Conventional techniques presently exist to determine capacitance values of IC designs, and example parasitic capacitance calculation methods include rigorous simulation and phenomenological modeling. Rigorous simulation can be performed using field solvers and may provide physically accurate solutions by calculating electromagnetic parameters and capacitances by directly solving Maxwell's equations. This means, however, that rigorous simulations have high computational requirements and calculation latencies, and the high-performance demands and lengthy time requirements for rigorous simulations can be immense and impractical for complex, modern IC designs. Phenomenological modeling may compute parasitic capacitances by dividing an IC layout into predetermined capacitance sections (such as parallel plate and fringe capacitance sections) and separately calculate each section's capacitance values. Phenomenological modeling processes may also be computationally intensive and lack the accuracy of rigorous simulation techniques. As such, modern parasitic extraction processes to determine IC capacitance values may be computationally burdensome and inefficient, especially as circuit complexity increases.

The disclosure herein may provide systems, methods, devices, and logic for shadow feature-based determinations of capacitance values for IC designs and layouts. As described in greater detail herein, shadow feature technology may support characterization of how IC components (e.g., nets, layout polygons, conductive parts, or any discrete or specified circuit element) relate to other surrounding conductive components. In that regard, a shadow feature may be a numerical parameter that can be used to correlate IC components to surrounding components, and may be indicative or representative of capacitive coupling effects that IC components exhibit on an IC design. Shadow spaces may be determined for IC components to unobstructed portions of surrounding IC layout components, and area and distance values of determined shadow spaces may be used to extract shadow feature values to characterize components of the IC layout. Machine learning (ML) models can be trained using training data comprised of extracted shadow features. Shadow features may be scalar and unitless, which may increase the applicability and efficiency for computing shadow features from IC layouts. ML models can be trained and determine capacitance for input IC layouts with increased computational efficiency and accuracy, for example as compared with conventional techniques such as rigorous simulation, phenomenological modeling, and other computationally-intensive parasitic extraction flows.

These and other aspects of shadow feature technology according to the present disclosure and the technical benefits of such shadow feature technology are described in greater detail herein.

FIG. 1 shows an example of a computing system 100 that supports shadow feature-based determination of capacitance values for IC layouts. The computing system 100 may take the form of a single or multiple computing devices such as application servers, compute nodes, desktop or laptop computers, smart phones or other mobile devices, tablet devices, embedded controllers, and more. In some implementations, the computing system 100 hosts, instantiates, executes, supports, or implements an EDA application that supports circuit design and analysis, and may accordingly provide or implement any of the shadow feature technology described herein.

As an example implementation to support any combination of the shadow feature technology described herein, the computing system 100 shown in FIG. 1 includes a shadow feature model training engine 110 and shadow feature application engine 112. The computing system 100 may implement the engines 110 and 112 (including components thereof) in various ways, for example as hardware and programming. The programming for the engines 110 and 112 may take the form of processor-executable instructions stored on a non-transitory machine-readable storage medium and the hardware for the engines 110 and 112 may include a processor to execute those instructions. A processor may take the form of single processor or multi-processor systems, and in some examples, the computing system 100 implements multiple engines using the same computing system features or hardware components (e.g., a common processor or a common storage medium).

In operation, the shadow feature model training engine 110 may access a set of IC layouts and capacitance values determined for components of the set of IC layouts. The shadow feature model training engine 110 may construct shadow feature training data for the set of IC layouts, including by, for a given component of an IC layout in the set of IC layouts, extracting a shadow feature for the given component and combining the shadow feature and a determined capacitance value for the given component into a shadow feature training data sample of the shadow feature training data. The shadow feature may include a unitless, scalar value computed from shadow space areas and distances between the given component to unobstructed portions of surrounding components of the IC layout, and the unobstructed portions may be unblocked along a linear view to the given component by any other component of the IC layout. The shadow feature model training engine 110 may further train an ML model with the shadow feature training data.

In operation, the shadow feature application engine 112 may access an input IC layout, extract shadow features for components of the input IC layout (and may do so in a manner consistent with the shadow feature model training engine 110), provide the extracted shadow features for the components of the input IC layout to the trained ML model, and determine capacitance values for the input IC layout via the trained ML model.

These and other aspects of shadow feature technology according to the present disclosure are described in greater detail next.

Figure 2:
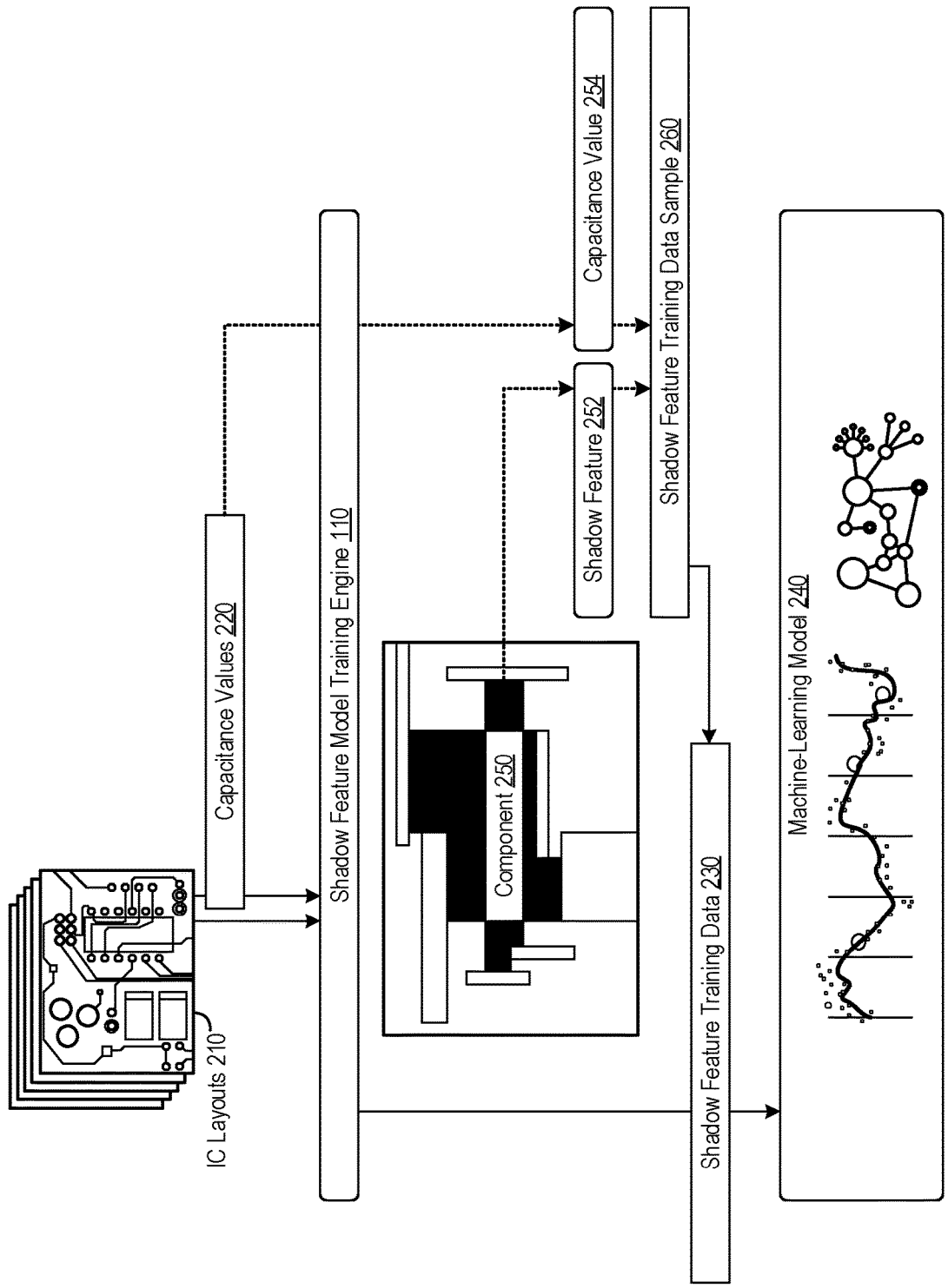
FIG. 2 shows an example extraction of shadow features from IC layouts to train a machine learning model.

FIG. 2 shows an example extraction of shadow features from IC layouts to train an ML model. By extracting shadow features from existing or previously designed IC layouts and correlating the extracted shadow features to determined capacitance values, ML training can be used to model, learn, or otherwise determine shadow feature-to-capacitance mappings. As such, predictive modeling to determine capacitance values based on shadow features can be supported through ML models trained with extracted shadow features as described according to the present disclosure.

In the example shown in FIG. 2, the shadow feature model training engine 110 accesses a set of IC layouts 210. The IC layouts 210 may be in the form of circuit designs, for example as physical layout data generated, designed, or generated through EDA applications. The set of IC layouts 210 include any number of different circuit designs, e.g., of varying type and complexity, and may be represented as any digital format that stores, implements, or characterizes circuit layouts. As such, the set of IC layouts 210 may be in the form of physical design data, which may represent physical circuit designs, interconnects, and other circuit elements as polygons. The shadow feature model training engine 110 may also access capacitance values 220 determined for components of set of the IC layouts 210. The capacitance values 220 may be determined through any number or techniques, such as rigorous modeling, phenomenological modeling, physical measurements of physical chips manufactured based on the design of IC layouts 210, or in any other capacitance determination manner.

The shadow feature model training engine 110 may construct shadow feature training data 230 for the set of IC layouts 210 in order to train a ML model 240. The shadow feature training data 230 constructed by the shadow feature model training engine 110 may correlate shadow features extracted from individual IC layout components to capacitance values determined for the individual IC layout components. The ML model 240 may implement or provide any number of machine learning techniques and capabilities to analyze, interpret, and utilize shadow feature training data for capacitance determinations or in support of parasitic capacitance extraction processes. For instance, the ML model 240 may implement any number of supervised (e.g., support vector machines, or other supervised learning techniques), semi-supervised, unsupervised, or reinforced learning models to map shadow features to capacitance values, and thus support determination of capacitance values for IC layout component inputs or IC layout inputs. In some instances, the ML model 240 (after training) may output capacitance values for components of an input IC layout, doing so based on the shadow features extracted for the components of the input IC layout. Application of the ML model 240 for capacitance value determinations is described in greater detail herein, including with reference to FIG. 7.

To generate the shadow feature training data 230, the shadow feature model training engine 110 may extract shadow features from the IC layouts 210 on a per-component basis. A component of an IC layout may refer to any discrete or specified element of a circuit, and individual components may thus be in the form of individual nets, layout polygons, conductive circuit elements, and the like. As used herein, a shadow feature may refer to any extracted value intended to characterize IC layout components, e.g., to reflect or represent capacitive coupling effects of surrounding IC components. Through shadow features, the present disclosure may provide an elegant and computationally efficient mechanism to characterize IC layout components based on unobstructed non-conductive spaces between the IC layout components and other surrounding IC layout components.

To extract shadow features for a given component of an IC layout, the shadow feature model training engine 110 may identify surrounding components proximate to the given component. Surrounding components identified by the shadow feature model training engine 110 may include other IC layout components on a same layer in the circuit design as well as other IC layout components on different layers. For the identified surrounding components proximate to the given component, the shadow feature model training engine 110 may determine shadow spaces between the given component and each surrounding component. Shadow spaces may refer to any non-conductive portions of a circuit design that are unblocked between the given component and surrounding components, as explained herein. In some implementations, the shadow feature model training engine 110 may determine shadow spaces in 2-dimensions, even though the IC layouts 210 represent 3D circuit designs with 3D components. By reducing the dimensionality of IC layout analyses to 2D instead of 3D, shadow feature extractions according to the present disclosure may be performed with increased speed and efficiency. 2D computations (including area and distance computations) may be performed with increased speed and reduced computation strain, as compared complex 3D computations. As such, shadow feature technology may support reduced dimensionality computations for parasitic extraction flows, and decrease the execution latencies and improve system performance of EDA computing systems configured to perform parasitic extraction flows or capacitance determination processes.

The shadow feature model training engine 110 may determine shadow spaces between a given component and surrounding components in various ways, and shadow space determinations may vary based on whether the surrounding component is located on the same layer as the given component, on a different layer than the given component, and may be further based on whether the surrounding component includes any overlap along a design axis of the circuit design space that is perpendicular to the circuit layers (e.g., a Z-axis for layers mapped to X-Y planes). As described herein, the shadow feature model training engine 110 may also determine a shadow space between the given component and a ground layer of the circuit design, and may do so in a manner specific to the ground layer (differentiating the ground layer from other surrounding components). In that regard, the ground layer may also be referred to or understood as a surrounding component for purposes of shadow feature extraction.

From the determined shadow spaces for a given component, the shadow feature model training engine 110 may extract a shadow feature to characterize the given component. Extracted shadow features may be computed as a function of the areas of the shadow spaces and distances between the given component and surrounding components (including a ground layer) that form the shadow spaces. The shadow feature model training engine 110 may extract shadow features as unitless, scalar values (e.g., not in vector or directional form). By doing so, extracted shadow features may provide a data-compact representation for which to characterize components of IC layouts as vector directions need not be tracked and stored for shadow feature datasets.

An example shadow feature extraction is shown in FIG. 2 for the component 250, which may be a layout polygon or net located on a particular metal layer of an IC layout. In the example shown in FIG. 2, the shadow feature model training engine 110 may identify surrounding components for the component 250 and then determine shadow spaces as a space between the component 250 and unblocked portions of the surrounding components. Some example shadow spaces that the shadow feature model training engine 110 may determine for the component 250 are colored in black in FIG. 2. As can be seen in FIG. 2, at least some portions of the given component 250 are linearly unblocked to corresponding unobstructed portions of surrounding components identified for the given component 250. From the determined shadow spaces, the shadow feature model training engine 110 may extract a shadow feature 252 for the component 250. Then, the shadow feature model training engine 110 may combine the extracted shadow feature 252 with the capacitance value 254 determined for the component 250 in order to form a shadow feature training data sample 260. Such a combination may form a data pair between the shadow feature 252 and the capacitance value 254, for example by concatenating the capacitance value 254 to a list, array, or vector representation of the shadow feature 252, or in any other way designed to correlate or aggregate the shadow feature 252 and the capacitance value 254 of the component 250 into a data sample.

In such a manner, the shadow feature model training engine 110 may generate shadow feature training data samples on a per-component basis for the IC layouts 210. Together, the generated samples may form the shadow feature training data 230 which the shadow feature model training engine 110 may provide as a training dataset to the ML model 240.

In some implementations, the shadow feature model training engine 110 may extract shadow features that separately account for different types of capacitive coupling for surrounding components. For example, the shadow feature model training engine 110 may extract the shadow feature 252 for the component 250 such that the shadow feature 252 includes a same-layer shadow feature value, a different-layer shadow feature value, and a ground-layer shadow feature value. As the naming suggests, these different values of the shadow feature 252 (determined for the individual component 250) may represent distinct values, each respectively extracted for surrounding components on a same layer as a given component, on a different layer as the given component, and for a ground layer. Each of the same-layer shadow feature value, the different-layer shadow feature value, and the ground-layer shadow feature value may be separately extracted by the shadow feature model training engine 110 and represented as distinct unitless, scalar values. For instance, the shadow feature model training engine 110 may represent the shadow feature 252 as an array, list, or feature vector that includes three (3) distinct values, namely the same-layer shadow feature value, the different-layer shadow feature value, and the ground-layer shadow feature value.

Figure 3:
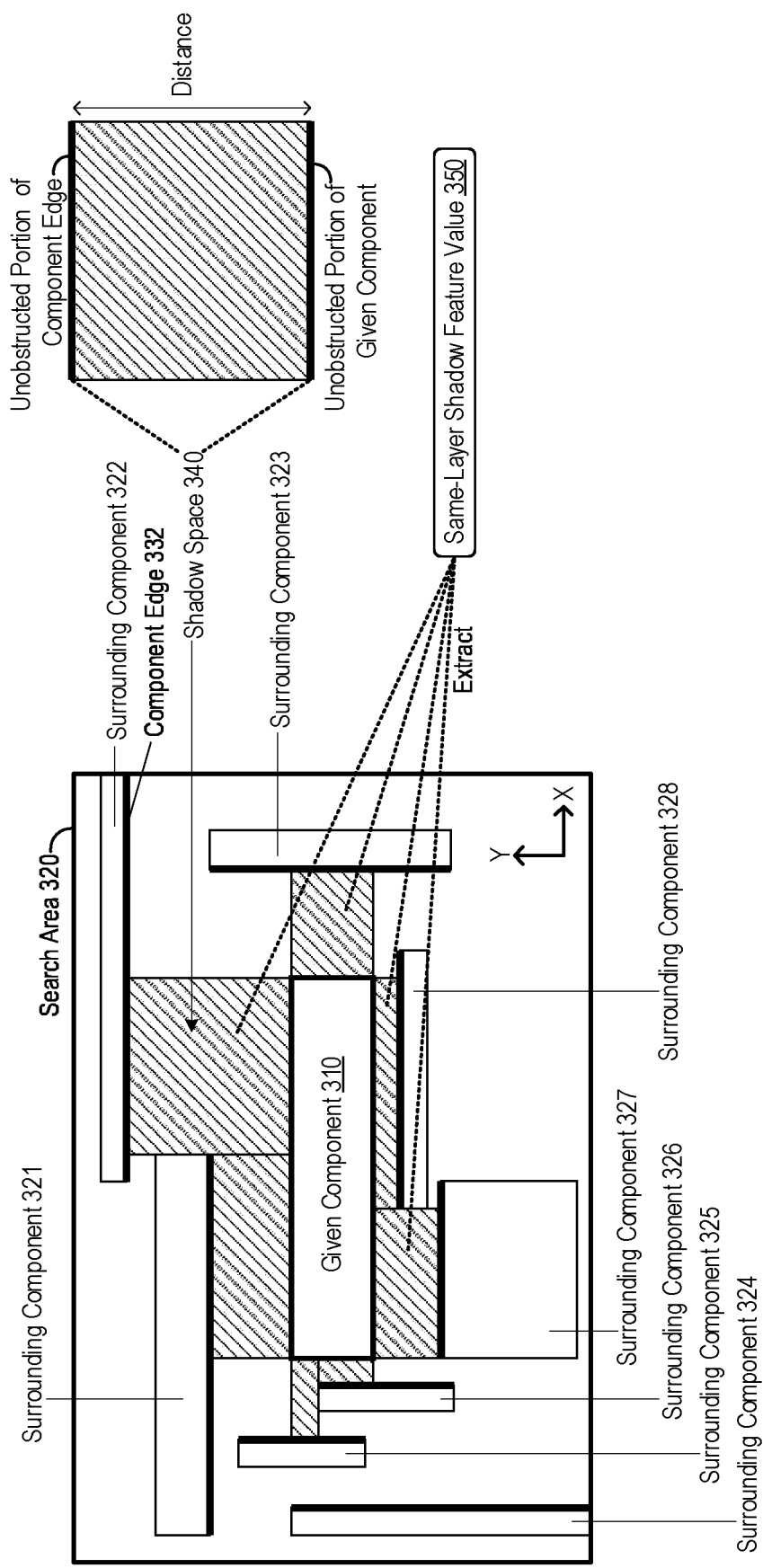
FIG. 3 shows an example extraction of a same-layer shadow feature value for a component of an IC layout.
Figure 4:
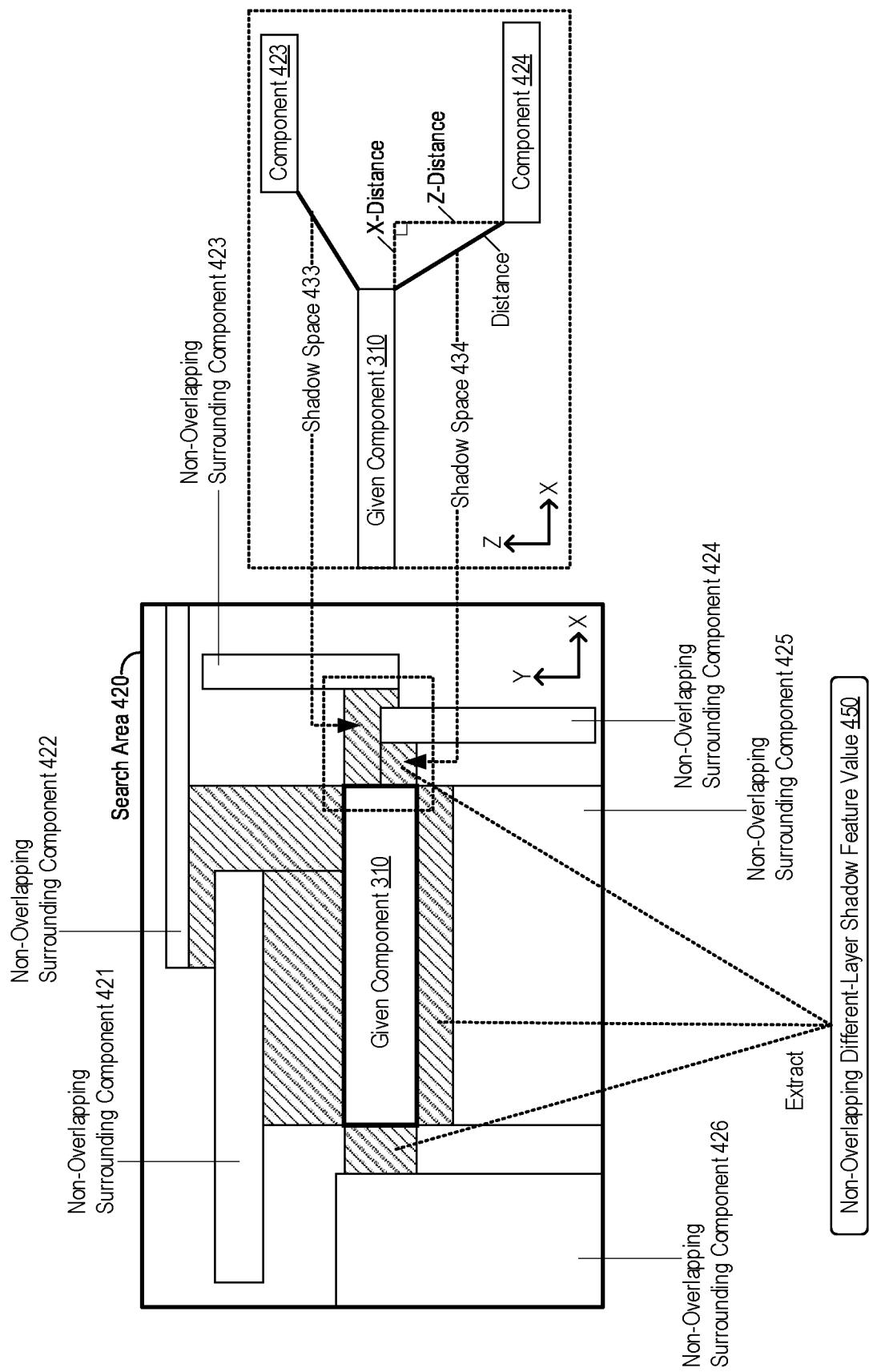
FIG. 4 shows an example extraction of a non-overlapping different-layer shadow feature value for a component of an IC layout.
Figure 5:
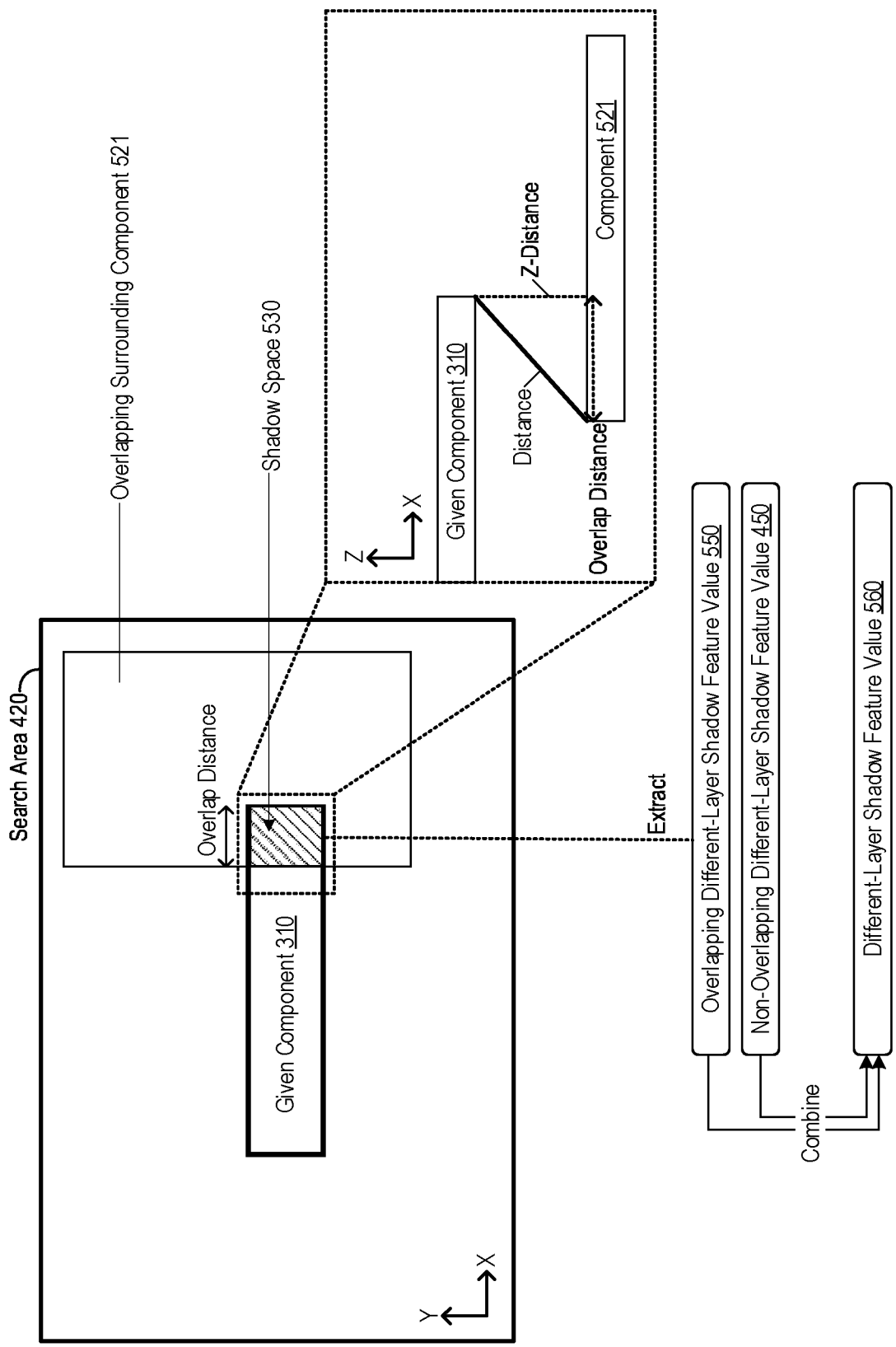
FIG. 5 shows an example extraction of an overlapping different-layer shadow feature value for a component of an IC layout.
Figure 6:
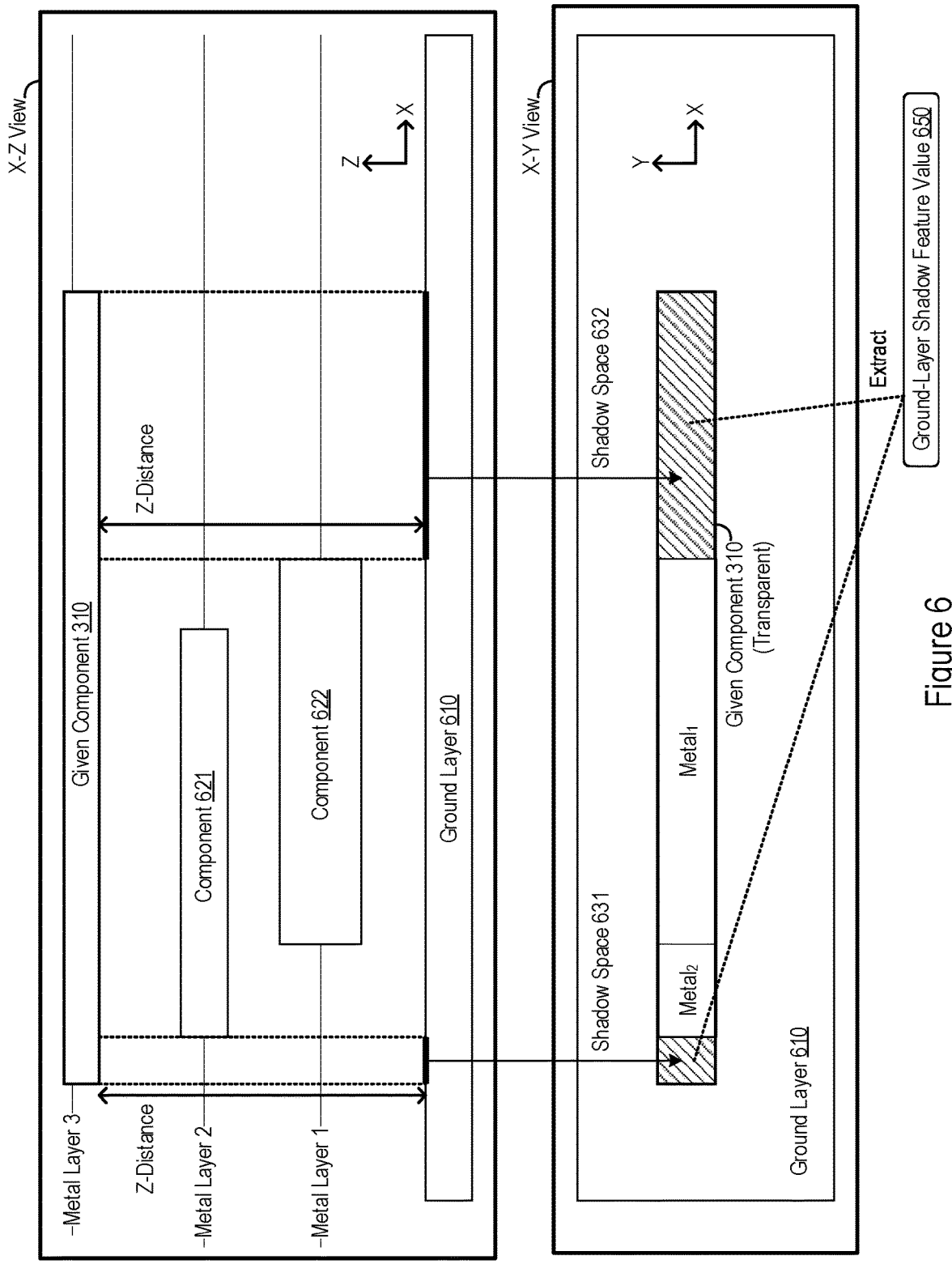
FIG. 6 shows an example extraction of a ground-layer shadow feature value for a component of an IC layout.

Example aspects of extracting same-layer shadow feature values, different-layer shadow feature values, and ground-layer shadow feature values included in a shadow feature are described next with respect to FIGS. 3-6. FIG. 3 provides example aspects of extractions of same-layer shadow feature values, FIGS. 4-5 provide example aspects of extractions of different-layer shadow feature values, and FIG. 6 provides example aspects of extractions of ground-layer shadow feature values. Each are described in turn.

FIG. 3 shows an example extraction of a same-layer shadow feature value for a component of an IC layout. The same-layer shadow feature value extraction of FIG. 3 is described using the shadow feature model training engine 110 as an example, by such an extraction may be implemented or performed by any computing system or system component, including by the shadow feature application engine 112. As noted herein, the shadow feature model training engine 110 may extract shadow features on a per-component basis. FIG. 3 includes a given component 310 for which the shadow feature model training engine 110 may extract a shadow feature, which is used as a continuing example herein. Shadow feature extraction for the given component 310 may include determining a same-layer shadow feature value of the shadow feature for the given component 310.

To determine a same-layer shadow feature value of the shadow feature extracted for the given component 310, the shadow feature model training engine 110 may identify surrounding components on a same layer of an IC layout as the given component 310. In some implementations, the shadow feature model training engine 110 may do by identifying any other components of an IC layout on the same layer as the given component 310 and (at least partially) located within a search area 320. The search area 320 may be defined by the shadow feature model training engine 110 as a bounding box that surrounds (e.g., is centered on) the given component 310. The dimensions, parameters, or range of the search area 320 may be set as predetermined values, user-configurable, assigned default system values, and otherwise configured in any number of additional or alternative ways.

In the example of FIG. 3, the shadow feature model training engine 110 identifies eight (8) different components of an IC layout that are on the same layer as the given component 310 and at least partially located within the search area 320. These identified same-layer surrounding components are labeled in FIG. 3 as surrounding components 321-328. For the surrounding components 321-328, the shadow feature model training engine 110 may determine which portions (e.g., edges) of the surrounding components 321-328 are unobstructed or unblocked to the given component 310. For same-layer shadow feature value determinations, the shadow feature model training engine 110 may determine blocked and unblocked portions of surrounding components linearly along the design axes (e.g., X-axis and Y-axis) of a circuit design space in which a circuit layer of the given component 310 is represented. The shadow feature model training engine 110 may thus determine which portions of the surrounding components 321-328 are unblocked linearly along the +X, −X, +Y, and −Y directions to the given component 310 (or vice versa).

To elaborate further, the shadow feature model training engine 110 may determine unobstructed portions of surrounding components 321-328 that are not blocked along a linear view to the given component 310 by any other component of the IC layout. These unblocked spaces between the given component 310 and the surrounding components 321-328 may form same-layer shadow spaces that the shadow feature model training engine 110 may determine for the given component 310. In the example of FIG. 3, the shadow feature model training engine 110 determines the various shadow spaces shown in FIG. 3 as infilled with diagonal patterning. Each shadow space is formed by an unobstructed portion of the given component 310 and a corresponding unobstructed portion of a surrounding component linearly unblocked along a +X, −X, +Y, or −Y direction between the given component 310 and the surrounding component.

Note that the shadow feature model training engine 110 may determine shadow spaces using component edges. For shadow feature computations, the shadow feature model training engine 110 may compress representations of identified surrounding components into component edges, e.g., treat or otherwise represent a surrounding component as the component edge of the surrounding component that is closest in distance to or faces the given component 310. By doing so, the shadow feature model training engine 110 may increase execution efficiency and reduce computational latencies for shadow feature extraction processes since shadow space determinations may be narrowed into a 2D space and simplified into edge relation geometrical characterizations and computations. One example of such an edge representation is shown in FIG. 3, in which the shadow feature model training engine 110 may represent the surrounding component 322 via the component edge 332 of the surrounding component 322. In some implementations, the shadow feature model training engine 110 may select a given component edge of the given component 310 (on a per-component basis) for shadow space determinations, e.g., a component edge of the given component 310 closest to the surrounding component.

For the surrounding component 322, the shadow feature model training engine 110 may determine unobstructed portions of the given component 310 and the component edge 332 along a +Y direction from the given component 310 to the component edge 332 that are not blocked by any other component of the IC layout. As seen in FIG. 3, the shadow feature model training engine 110 may determine the shadow space 340 formed between the unobstructed portions of the given component 310 and the surrounding component 322 (and in particular, the unobstructed portions of the component edge 332). A larger view of the shadow space 340 is shown in FIG. 3, which may take the form of a 2D shape defined with two of the shape edges respectively defined by the unobstructed portion of the given component 310 and the unobstructed portion of the component edge 332 (and thus unobstructed portion of the surrounding component 322).

As can be seen in FIG. 3, only some portions of the component edge 332 (and thus only some portions of the surrounding component 322) are unobstructed linearly to the given component 310 along the Y-axis direction. This may be the case as surrounding component 321 (including its component edge) obstructs a portion of surrounding component 322 along the Y direction. The shadow feature model training engine 110 may determine a separate shadow space between the unobstructed portions of the given component 310 and the surrounding component 321, and this separately determined shadow space may be distinct from the shadow space 340 determined by the shadow feature model training engine 110 for the surrounding component 322. Accordingly, the shadow feature model training engine 110 may determine shadow spaces between the given component 310 and identified same-layer surrounding components, doing so to determine separate shadow spaces for different surrounding components of the given component 310.

It is possible that the shadow feature model training engine 110 may determine that no shadow space exists between the given component and a particular surrounding component identified as proximate to the given component. This may be the case, for example, when no portion of the a particular same-layer surrounding component (e.g., as represented by its component edge closest to the given component 310) is unobstructed linearly along a +X, −X, +Y, or −Y direction to the given component 310. An example of such a surrounding component for which a shadow space does not exist is illustrated in FIG. 3 via the surrounding component 324. No portion of the component edge that represents surrounding component 324 is unobstructed linearly along a +X, −X, +Y, or −Y direction to the given component 310. Note that in FIG. 3, the given component 310 and the surrounding component 324 are linearly obstructed along the x-direction by the surrounding component 325 and portions of the surrounding component 326. As such, the shadow feature model training engine 110 may determine that no shadow space is formed by the given component 310 and surrounding component 324 since no portion of the given component 310 is linearly unobstructed to any portion of the given component 310 (and vice versa).

The shadow feature model training engine 110 may determine a separate shadow space (if one exists) for each identified surrounding component. In the example of FIG. 3, the shadow feature model training engine 110 determines seven (7) distinct shadow spaces between unobstructed portions of the given component 310 and surrounding components 321, 322, 323, 325, 326, 327, and 328 respectively. The shadow feature model training engine 110 may compute a same-layer shadow feature value from the determined space spaces, and in particular as a function of the determined space areas and the distances between the given component 310 and the unobstructed portions of the same-layer surrounding components. In the example of FIG. 3, the shadow feature model training engine 110 extracts the same-layer shadow feature value 350 from the shadow spaces determined for the given component 310 (note for visual clarity, dotted lines to the same-layer shadow feature value 350 are only depicted for some, but not all, of the illustrated shadow spaces).

To explain further, the shadow feature model training engine 110 may determine a shadow space area and a shadow space distance for each shadow space determined for a given component. The shadow feature model training engine 110 may then compute a same-layer shadow feature value as a function of the determined shadow space areas and shadow space distances. Shadow space areas may be computed by the shadow feature model training engine 110 based on the dimensions of each respective shadow space. For regularly-shaped shadow spaces, such dimensions may be determined as the length of unobstructed portions of the given component 310 and a corresponding component edge as well as the distance between the component edge to the given component 310. The distance between unobstructed portions of the given component 310 and a surrounding component may be the shadow space distance that the shadow feature model training engine 110 determines for the formed shadow space. An example of such is shown for the shadow space 340 in FIG. 3, for which the shadow feature model training engine 110 may compute the shadow space area as the product of a length of the unobstructed portion of the component edge 332 (which may be equal to the unobstructed portion of the given component 310 to surrounding component 322) multiplied by the distance between the unobstructed portions. This distance between the unobstructed portions may be identified by the shadow feature model training engine 110 as the shadow space distance for the shadow area 340.

For irregularly-shaped layout polygons (or even for regularly shaped polygons), shadow space areas may be determined via EDA analysis flows that designed to analyze non-conductive spaces components of an IC layout, and the feature model training engine 110 may determine the shadow space distance as the minimum distance, average distance, or any other computed distance between the unobstructed edge of the given component 310 and the corresponding component edge of the surrounding component for which the shadow space is formed.

For each shadow space, the shadow feature model training engine 110 may compute a shadow space value based on the shadow space area and the shadow space distance for the shadow space. In some implementations, the shadow feature model training engine 110 computes this shadow space value (on a per-shadow space basis) as the shadow space area divided by the shadow space distance squared. Doing so may yield a unitless and scalar value, which may represent or characterize a specific shadow space. To illustrate, the shadow feature model training engine 110 may compute a shadow space value for the shadow space 340 shown in FIG. 3, e.g., as a unitless scalar value computed as the area of shadow space 340 divided by the squared value of the distance between the component edge 332 and the given component 310.

The shadow feature model training engine 110 may extract a same-layer shadow feature value for the given component 310 as a function of the shadow space values computed for each of the same-layer shadow spaces. For example, the shadow feature model training engine 110 may sum the shadow space values individually computed for each of the seven (7) shadow spaces determined for the given component 310 in order to determine the same-layer shadow feature value 350. Doing so may aggregate, combine, or otherwise account each of the individually-determined shadow spaces into a single numerical value in the form of the same-layer shadow feature value 350. In this example, the same-layer shadow feature value 350 may be unitless and scalar, as the sum of the unitless, scalar shadow space values individually computed for each same-layer shadow space may likewise be unitless and scalar.

In any of the ways described herein, the shadow feature model training engine 110 may extract same-layer shadow feature values for components of an IC layout. The shadow feature model training engine 110 may do so by determining space areas and distances between a given component and unobstructed portions of same-layer surrounding components of the IC layout, also referred to herein as shadow space areas and shadow space distances. A same-layer shadow feature value may be computed as a function of the determined space areas and the distances between the given component and the unobstructed portions of the same-layer surrounding components, e.g., as a sum of the shadow space values individually computed for each of the determined same-layer shadow spaces for a given component.

A same-layer shadow feature value may comprise but one of multiple elements of a shadow feature extracted for a component of an IC layout. A different-layer shadow feature value may also be determined as part of the shadow feature extraction process for a given component of an IC layout. In determining a different-layer shadow feature value, the shadow feature model training engine 110 may determine a shadow feature value that accounts, characterizes, or represents surrounding components on different layers than a given component. Moreover, the shadow feature model training engine 110 may determine shadow space areas and shadow space distances differently based on whether or not surrounding components overlap with a given component on a design axis (e.g., a Z-axis) of a circuit design space perpendicular to the planes in which that the circuit layers are represented. Such a distinction is explained in greater detail through FIGS. 4 and 5.

FIG. 4 shows an example extraction of a non-overlapping different-layer shadow feature value for a component of an IC layout. The non-overlapping different-layer shadow feature value extraction of FIG. 4 is described using the shadow feature model training engine 110 as an example, by such an extraction may be implemented or performed by any computing system or system component, including by the shadow feature application engine 112. FIG. 4 is also described using the continuing example of the given component 310 for which the shadow feature model training engine 110 may extract a shadow feature. Shadow feature extraction for the given component 310 may include determining a different-layer shadow feature value.

For different-layer shadow feature values, the shadow feature model training engine 110 may determine shadow spaces for different-layer surrounding components in alternate ways based on whether the different-layer surrounding components overlap with the given component 310 along a Z-axis of a circuit design space. As used herein, different-layer overlap between a given component and a different-layer surrounding component may refer to any spatial overlap along the design axis of the circuit design space that is perpendicular (e.g., normal) to the planes of the various circuit layers that the given component and different-layer surrounding components are located on. For circuit layers designed in an X-Y plane, the Z-axis may be such a perpendicular design axis. Thus, overlap may occur when at least some portion of a different-layer surrounding component spatially overlaps with the given component along the Z-axis. Explained in another way, overlap may occur between a given component 310 and a different-layer surrounding component when a projection of the given component 310 along the Z-axis onto the layer of the differently-layer surrounding component results in at least some portion of the given component 310 and the different-layer surrounding component occupying the same spatial location on the layer.

The shadow feature model training engine 110 may identify other components of an IC layout that are non-overlapping, located on a different layer, and proximate to the given component 310, identifying such components as non-overlapping surrounding components to the given component 310. To do so, the shadow feature model training engine 110 may identify any non-overlapping components on different layers as the given component 310 and within a search area 420. The search area 420 designated by the shadow feature model training engine 110 may be a 3D bounding box, for example centered around the given component 310. The search area 420 may be configurable, and extend across a predetermined circuit height, length, or width or across a specified number of circuit layers (e.g., +2 and −2 layers). For example, the given component 310 may be located on metal layer 3 of a circuit design, and the search area 420 employed by the shadow feature model training engine 110 may extend to metal layers 1, 2, 4, and 5 of the circuit design to identify non-overlapping surrounding components.

In FIG. 4, examples of different non-overlapping surrounding components that the shadow feature model training engine 110 may identify are shown as non-overlapping surrounding components 421-426. Note that each of the non-overlapping surrounding components 421-426 may be located on a different layer from the given component 310 to account for the capacitive coupling effects between the given component 310 and different-layer components of an IC layout. In some instances, the non-overlapping surrounding components 421 may be located on different layers from one another, as some may be located on layers below the given component 310 and others located on layers above the given component 310. In such a manner, the shadow feature model training engine 110 may identify non-overlapping surrounding components for a given component 310 that are located on different layers of a circuit design from the given component 310.

The shadow feature model training engine 110 may perform shadow space determinations for the given component 310 and the identified non-overlapping surrounding components 421-426. In doing so, the shadow feature model training engine 110 may identify any unobstructed portions of the given component 310 that are linearly unblocked to the non-overlapping surrounding components 421-426 (e.g., unobstructed portions thereof). The shadow feature model training engine 110 may make determinations of unobstructed portions of the given component 310 and the non-overlapping surrounding components 421-426 in a consistent manner as for surrounding components on the same layer of the given component 310 (e.g., for surrounding components 321-328 discussed for FIG. 3), with the added consideration that linear obstruction is determined between components on different layers of the circuit design. In some implementations, the shadow feature model training engine 110 may condense representation of surrounding components to the component edges that face or are closest in distance to the given component 310, and determinations of unobstructed portions that are not blocked linearly to the given component 310 may be performed with increased efficiency and speed.

In the example shown in FIG. 4, the shadow feature model training engine 110 determines a respective shadow space between the given component 310 and each of the non-overlapping surrounding components 421-426. The determined shadow spaces are illustrated through the diagonal patterning infilled for the unblocked non-conductive space between the given component 310 and each of the non-overlapping surrounding components 421-426 respectively. Note that the shadow feature model training engine 110 may determine shadow spaces that cross multiple layers of a circuit design, and may thus take the form of 2D shapes that extend from an edge portion of the given component 310 to an edge portion of a non-overlapping surrounding component. Shadow spaces between circuit layers may thus be in the form of 2D shapes that tilt, are angled, or diagonally extend across circuit layers of a circuit design.

By determining shadow spaces in 2D forms (even across different circuit layers), the shadow feature technology described herein may support shadow feature computations for 2-dimensionalities as opposed to 3D shapes and computations that can be increasingly complex, time-consuming, and resource intensive. Increased computational efficiency of EDA computing systems can be achieved through such shadow space determinations according to the present disclosure.

As examples of different-layer shadow spaces that the shadow feature model training engine 110 may determine, shadow spaces 433 and 434 are shown in FIG. 4. Shadow space 433 may extend from unobstructed portions of a component edge of the given component 310 to unobstructed portions of a component edge of the non-overlapping surrounding component 423. Shadow space 434 may extend from unobstructed portions of a component edge of the given component 310 (which may be different component edge of the given component 310 from that which forms the shadow space 433) to unobstructed portions of a component edge of the non-overlapping surrounding component 424. In the example of FIG. 4, the shadow spaces 433 and 434 extend from the given component 310 to different layers in a circuit design, with shadow space 433 extending to a layer above the given component 310 and shadow space 434 extending to a layer below the given component 310.

The shadow feature model training engine 110 may determine a shadow space area and a shadow space distance for each of the shadow spaces determined from the non-overlapping surrounding components 421-426. For a shadow space distance, the shadow feature model training engine 110 may determine the cross-layer distance for which a determined shadow space extends from the given component 310 to a component edge of a non-overlapping surrounding component. An example of such a shadow space distance computation is illustrated in FIG. 4 for the shadow space 434. In such a case, the shadow feature model training engine 110 may determine the shadow space distance for the shadow space 434 by determining a hypotenuse value for a right triangle formed with sides that include the X-distance of displacement between the component edge of the given component 310 and the component edge of the non-overlapping surrounding component 424 and the Z-distance of displacement between the component edge of the given component 310 and the component edge of the non-overlapping surrounding component 424. For non-regular component edges or irregularly-shaped shadow spaces, the shadow feature model training engine 110 may compute the shadow space distance as a function of the varying distances between the given component 310 and the non-overlapping surrounding component (e.g., least distance value, average distance value, maximum distance value, etc.).

For shadow space areas, the shadow feature model training engine 110 may compute the area of the 2D shape defined by each respective shadow space. For regular shapes (e.g., rectangular 2D shadow spaces), the shadow feature model training engine 110 may compute shadow space areas by multiplying the shadow space distance with the length of the unobstructed portion of the non-overlapping surrounding component (or, the unobstructed portion of the given component 310, since these may be equal for regular 2D shadow spaces). Such a computation may, in effect, be an area computation since the length of the unobstructed portions and the shadow space distance may represent the length and width of the 2D rectangle that represents the shadow space. For non-regular component edges or irregularly-shaped shadow spaces, the shadow feature model training engine 110 may compute shadow space areas as via integral computations, or may obtain such area computations from other processes of EDA flows. In any of the ways described herein, the shadow feature model training engine 110 may compute shadow space areas and shadow space distances for shadow spaces determined from non-overlapping surrounding components on different layers than a given component 310.

In a similar manner as with shadow spaces determined for same-layer surrounding components, the shadow feature model training engine 110 may compute a shadow space value based on the shadow space area and the shadow space distance, and may do so for each shadow space determined from non-overlapping surrounding components. As noted herein, the shadow feature model training engine 110 may compute this shadow space value on a per-shadow space basis, and may do as the shadow space area divided by the shadow space distance squared, as doing so may yield a unitless and scalar value that represents or characterizes a specific shadow space.

In the example of FIG. 4, the shadow feature model training engine 110 computes the shadow space values for each of the determined different-layer shadow spaces and may aggregate (e.g., sum) the individually-computed shadow space values to determine the non-overlapping different-layer shadow feature value 450. The non-overlapping different-layer shadow feature value 450 may characterize a capacitive relationship between the given component 310 and identified non-overlapping surrounding components. The IC layout may also include overlapping surrounding components for the given component 310, and the shadow feature model training engine 110 may account for such overlapping surrounding components by determining an overlapping different-layer shadow feature value, as described next with reference to FIG. 5.

FIG. 5 shows an example extraction of an overlapping different-layer shadow feature value for a component of an IC layout. The overlapping different-layer shadow feature value extraction of FIG. 5 is described using the shadow feature model training engine 110 as an example, by such an extraction may be implemented or performed by any computing system or system component, including by the shadow feature application engine 112. FIG. 5 is also described using the continuing example of the given component 310 for which the shadow feature model training engine 110 may extract a shadow feature. Shadow feature extraction for the given component 310 may include determining a different-layer shadow feature value, of which an overlapping different-layer shadow feature value forms a part.

The shadow feature model training engine 110 may identify other components of an IC layout that are overlapping, located on a different layer, and proximate to the given component 310, identifying such components as overlapping surrounding components to the given component 310. To do so, the shadow feature model training engine 110 may identify any overlapping components on different layers as the given component 310 and within a search area. In the example shown in FIG. 5, the shadow feature model training engine 110 uses the same search area 420 used to identify non-overlapping surrounding components, though it is contemplated that different search areas can be applied to identify different types of surrounding components for the given component 310.

In FIG. 5, an example of an overlapping surrounding component that the shadow feature model training engine 110 may identify is shown as overlapping surrounding component 521. The overlapping surrounding component 521 may be located on a different layer from the given component 310, and portions of the overlapping surrounding component 521 may overlap along the Z-axis with portions of the given component 310. The overlapping portions of the overlapping surrounding component 521 and the given component 310 are illustrated in FIG. 5 through diagonal patterning infilling the overlapping area. Although located on different layers, a projection of the given component 310 onto the layer of the overlapping surrounding component 521 (or vice versa) may result in a component overlap region as diagonally patterned.

The shadow feature model training engine 110 may perform shadow space determinations for the given component 310 and the identified overlapping surrounding component 521. In doing so, the shadow feature model training engine 110 may identify any unobstructed portions of the given component 310 that are linearly unblocked to the overlapping surrounding components 521. Blocking may occur by other intervening components of an IC layout, such as another overlapping component located in a layer between the given component 310 and the overlapping surrounding component 521. Specifically for overlapping surrounding components, the shadow feature model training engine 110 may determine unobstructed portions of the given component 310 and the non-overlapping surrounding component 521 as an overlapping area that is unblocked along a design axis perpendicular to the circuit layers of the given component 310 and the overlapping surrounding component 521 (in this example, a Z-axis).

In the example shown in FIG. 5, the entire overlapping region between the given component 310 and the overlapping surrounding component 521 is unblocked along the Z-axis. As such, the shadow feature model training engine 110 may determine a shadow space 530 between the given component 310 and the overlapping surrounding component 521 as the entire overlapping region infilled with a diagonal pattern in FIG. 5. In a similar manner, the shadow feature model training engine 110 may determine shadow spaces for any other overlapping surrounding component as unblocked portions (along the Z-axis) of an overlapping region between the given component 310 and the other identified overlapping surrounding component. As such, shadow spaces determined from overlapping surrounding components may be in the form of 2D shapes determined from unblocked overlap between the given component 310 and overlapping surrounding components on different layers of a circuit design. Such shadow spaces may be 2D, and it may be understood that the total area of the shadow spaces determined for overlapping surrounding components cannot exceed twice the area of the given component 310 (for unblocked overlapping portions above and below the given component 310 in the circuit design space).

The shadow feature model training engine 110 may determine a shadow space area and a shadow space distance for each of the shadow spaces determined from the overlapping surrounding components, such as the overlapping surrounding component 521. For a shadow spaces specifically determined from overlapping surrounding components, the shadow feature model training engine 110 may determine a shadow space area as the area of the unblocked portions that form the shadow space. Thus, in FIG. 5, the shadow feature model training engine 110 may determine the shadow space area as an area value for the shadow space 530.

For shadow spaces determined from overlapping surrounding components, the shadow feature model training engine 110 may account for a distance between the given component 310 and the overlapping surrounding component in shadow space distance determinations. In some implementations, the shadow feature model training engine 110 may determine the shadow space distance of the shadow space 530 as a function of (i) a Z-distance between the given component 310 and the overlapping surrounding component 521, and (ii) an overlap distance between the given component 310 and the overlapping surrounding component 521. In this example, the Z-distance may be a displacement or distance value along the Z-axis between the given component 310 and the overlapping surrounding component 521 (e.g., distance along the Z-axis) between component edges.

The overlap distance may be determined by the shadow feature model training engine 110 as a distance value indicative of an extent of overlap between the given component 310 and the overlapping surrounding component 521. As such, overlap distance may be a dimension value of the shadow space 530, e.g., an X-dimension value or Y-dimension value of the shadow space 530. In the example shown in FIG. 5, the shadow feature model training engine 110 determines the overlap distance for the shadow space 530 as an X-dimension value of the shadow space 530, and further determines the shadow space distance of the shadow space 530 as the hypotenuse value of a right triangle formed by the Z-distance and the overlap distance. In other examples, (e.g., for overlapping surrounding components with overlap regions and shadow spaces formed (e.g., only) along a top or bottom edge of the given component 310, the shadow feature model training engine 110 may determine overlap distances based on an extent the shadow space extends into the given component 310 along the Y-axis.

The shadow feature model training engine 110 may compute a shadow space value based on the shadow space area and the shadow space distance for shadow spaces determined from overlapping surrounding components. As noted herein, the shadow feature model training engine 110 may compute this shadow space value on a per-shadow space basis, for example as the shadow space area divided by the shadow space distance squared. Doing so may yield a unitless and scalar value that represents or characterizes a specific shadow space. In the example of FIG. 5, the shadow feature model training engine 110 computes the shadow space value for shadow space 530, and may aggregate (e.g., sum) the individually-computed shadow space values of other shadow spaces determined from overlapping surrounding components to determine an overlapping different-layer shadow feature value 550.

The overlapping different-layer shadow feature value 550 may characterize a capacitive relationship between the given component 310 and identified overlapping surrounding components. The shadow feature model training engine 110 may combine (e.g., sum) or otherwise aggregate the overlapping different-layer shadow feature value 550 together with the non-overlapping different-layer shadow feature value 450 to form a different-layer shadow feature value 560. In doing so, the different-layer shadow feature value 560 may account for shadow spaces of both overlapping and non-overlapping different-layer surrounding components identified for the given component 310.

As described herein, the shadow feature model training engine 110 may determine a same-layer shadow feature value and a different-layer shadow feature value as part of a shadow feature extraction for a given component. These same-layer and different-layer components may be represented as discrete values (or sets of values), which may be unitless and scalar. As yet another example, a ground-layer shadow feature value may be determined as part of shadow feature extractions, examples of which are described next with reference to FIG. 6.

FIG. 6 shows an example extraction of a ground-layer shadow feature value for a component of an IC layout. The ground-layer shadow feature value extraction of FIG. 6 is described using the shadow feature model training engine 110 as an example, by such an extraction may be implemented or performed by any computing system or system component, including by the shadow feature application engine 112. FIG. 6 is also described using the continuing example of the given component 310 for which the shadow feature model training engine 110 may extract a shadow feature. Shadow feature extraction for the given component 310 may include determining a ground-layer shadow feature value, for example to account for a capacitive coupling effect between the given component 310 and a ground layer of a circuit design. In FIG. 6, an example ground layer of a circuit design is shown as the ground layer 610.

The shadow feature model training engine 110 may determine shadow spaces between the given component 310 and the ground layer 610 of a circuit design. Components of an IC layout may overlap with a ground layer along a design axis perpendicular to the circuit layers and ground layers of a circuit design. To determine a ground-layer shadow feature value for the given component 310, the shadow feature model training engine 110 may determine which portions of the given component 310 are unblocked to the ground layer 610. In the X-Z view shown in FIG. 6, the given component 310 is located on a metal layer 3 of a circuit design, with metal layers 1 and 2 positioned between the given component 310 and the ground layer 610. As can be seen in FIG. 6, portions of the given component 310 are blocked linearly along the Z-axis to the ground layer 610. Components 621 and 622 (located on metal layer 1 and metal layer 2 respectively) obstruct portions of the given component 310 linearly along the Z-axis to the ground layer 610.

As also seen in FIG. 6 in the X-Z view and the X-Y view, portions of the given component 310 are unblocked along the Z-axis to the ground layer 610. In particular, the X-Y view of FIG. 6 illustrates a top-down view with the given component 310 illustrated transparently. Portions of the given component are blocked along the Z-axis in the top-down view to the ground layer 610. However, other portions of the given component 310 that overlap with the ground layer 610 along the Z-axis are unblocked along the Z-axis to the ground layer 610. As such, the shadow feature model training engine 110 may determine such unobstructed portions of the given component 310 as shadow spaces for the ground-layer shadow feature value extraction. In FIG. 6, the shadow feature model training engine 110 determines shadow space 631 and shadow space 632 between the given component 310 and the ground layer 610. Shadow spaces for the ground-layer shadow feature value extractions may thus be determined as unobstructed portions of a given component 310 that are not blocked along a Z-axis to the ground layer 610. Such shadow spaces may take the form of 2D shapes (e.g., in an X-Y plane of the given component 310) that define the unblocked portions of the given component 310 in the X-Y plane.

The shadow feature model training engine 110 may determine shadow space areas and shadow space distances for the shadow spaces 631 and 632 determined from the ground layer 610. The shadow space area of a given shadow space may be computed by the shadow feature model training engine 110 as the area of the 2D shape that defines the shadow space. Thus, the shadow feature model training engine 110 may compute an area value of the 2D shape that defines the shadow space 631 as the shadow space area of the shadow space 631. In a similar manner, the shadow feature model training engine 110 may compute the shadow space area of the shadow space 632. For shadow space distances for ground-layer shadow feature value extractions, the shadow feature model training engine 110 may determine a Z-distance between the given component 310 and the ground layer 610, using the determined Z-distance as the shadow space distance for each shadow space. Example Z-distances that the shadow feature model training engine 110 may determine for the shadow spaces 631 and 632 are respectively shown in the X-Z view of FIG. 6.

The shadow feature model training engine 110 may compute a shadow space value based on the shadow space area and the shadow space distance for shadow spaces determined from the ground layer 610. As noted herein, the shadow feature model training engine 110 may compute this shadow space value on a per-shadow space basis, for example as a function that computes a shadow space value as the shadow space area divided by the shadow space distance squared. Doing so may yield a unitless and scalar value that represents or characterizes a specific shadow space. In the example of FIG. 6, the shadow feature model training engine 110 may compute a respective shadow space value for the shadow spaces 631 and 632, and may then aggregate (e.g., sum) the individually-computed shadow space values to determine an ground-layer shadow feature value 650.

As described herein, shadow feature technology may include shadow feature extractions on a per-component basis. Shadow feature extractions can result in generation of multiple different feature values that together form a shadow feature, including a same-layer shadow feature value, a different-layer shadow feature value, and a ground-layer shadow feature value as some examples. The shadow feature model training engine 110 may extract shadow features that account for or include any combination of these aspects of determined shadow spaces, for example as separate feature values in shadow features represented in a feature vector format. In such instances, the shadow feature model training engine 110 may generate a shadow feature for a given component that includes at least three different feature values, e.g., a same-layer shadow feature value, a different-layer shadow feature value, and a ground-layer shadow feature value as described herein.

In some implementations, the shadow feature model training engine 110 may generate or extract shadow features that account for second order or non-linear capacitance effects, such as fringe effects between a given IC component and surrounding components. For instance, the shadow feature model training engine 110 may determine non-linear shadow feature values for a given component based on surrounding components on a same layer as the given component, surrounding components on different layers as the given component (including overlapping and non-overlapping surrounding components), and between the given component and a ground layer. In some implementations, the shadow feature model training engine may determine different shadow feature values to account for non-linear, second-order, or fringe capacitance effects, and do so based on shadow space areas and shadow space distances computed for surrounding components and a ground layer.

As an illustrative example, the shadow feature model training engine 110 may determine a same-layer non-linear shadow feature value, doing so based on shadow space areas of and shadow space distances of determined same-layer shadow spaces for a given IC component. In this example, the shadow feature model training engine 110 may compute the same-layer non-linear shadow feature value in a similar manner as determining the same-layer feature value 350 for the given component 310 described herein, but may do by applying a logarithmic function to determine a shadow space value for each same-layer shadow space. As one example, the shadow feature model training engine 110 may determine a non-linear shadow space value for a given shadow space through a function that computes as the natural log of 1 plus the shadow space area divided by a squared value of the shadow space distance (e.g., ln (1+(shadow space area/shadow space distance$^2$), which may further be tuned by any multiplier parameter value). Then, the shadow feature model training engine 110 may determine the same-layer non-linear shadow feature value by aggregating (e.g., summing) the individual non-linear shadow space values computed for same-layer shadow spaces.

In a similar manner, the shadow feature model training engine 110 may determine a different layer non-linear shadow feature value by applying the logarithmic function to each determined different-layer shadow space, including for overlapping and non-overlapping surrounding components and the shadow space area and distance values determined for each of the different-layer shadow spaces. The shadow feature model training engine 110 may likewise determine a ground layer non-linear shadow feature value, doing so using the logarithmic function applied for each shadow space determined between a given component and a ground layer (e.g., applied to the shadow space area and distance values determined for such shadow spaces). Note that non-linear shadow feature values computed by the shadow feature model training engine 110 may be scalar and unitless, in that computation of these non-linear shadow feature values may be similar to computation of the same-layer, different-layer, and ground-layer shadow feature values described herein (though using a logarithmic function instead of, e.g., a linear function). As such, aggregation of non-linear shadow space values for determined shadow spaces can be easily and elegantly summed to form feature values that characterize fringe, non-linear, or second-order capacitance effects for a given component.

In some implementations, the shadow feature model training engine 110 may selectively determine non-linear shadow feature values based on the technology node size of a circuit design. For instance, the shadow feature model training engine 110 may set a node size threshold at 45 nanometers (nm) as one example. For circuit designs with technology node sizes less than 45 nm, the shadow feature model training engine 110 may extract shadow features that include six (6) shadow feature values, e.g., a same-layer shadow feature value, a same-layer non-linear shadow feature value, a different-layer shadow feature value, a different layer non-linear shadow feature value, a ground-layer shadow feature value, and a ground-layer non-linear shadow feature value. For circuit designs with technology node sizes that are not less than the 45 nm threshold, the shadow feature model training engine 110 may extract shadow features that include three (3) shadow feature values, a same-layer shadow feature value, a different-layer shadow feature value, and a ground-layer shadow feature value, e.g., without accounting for fringe capacitance effects that may not be as prevalent for circuit designs with larger technology node sizes. In doing so, the shadow feature technology described herein may flexibly balance performance and accuracy, which may improve performance of EDA computing systems performing parasitic extraction processes while also maintaining accuracy.

The shadow feature technology described herein may support an elegant, unitless, and scalar characterization of capacitive effects of individual components of IC layouts. Such characterizations may account for linear and non-linear capacitive effects for given components, including through multiple feature values as described herein. Extracted shadow features may thus form part of the training data used to train ML models in support of capacitance determinations via shadow feature technology. Training data may further include determined capacitance values for the individual components, through which a ML model 240 may be trained to determine capacitance values of IC layout components based on extracted shadow features. Upon training of an ML model 240 with shadow feature training data, the ML model 240 may be able to predict, map, determine, or otherwise output capacitance values based on input shadow features. Application of a trained ML model is described next with reference to FIG. 7.

Figure 7:
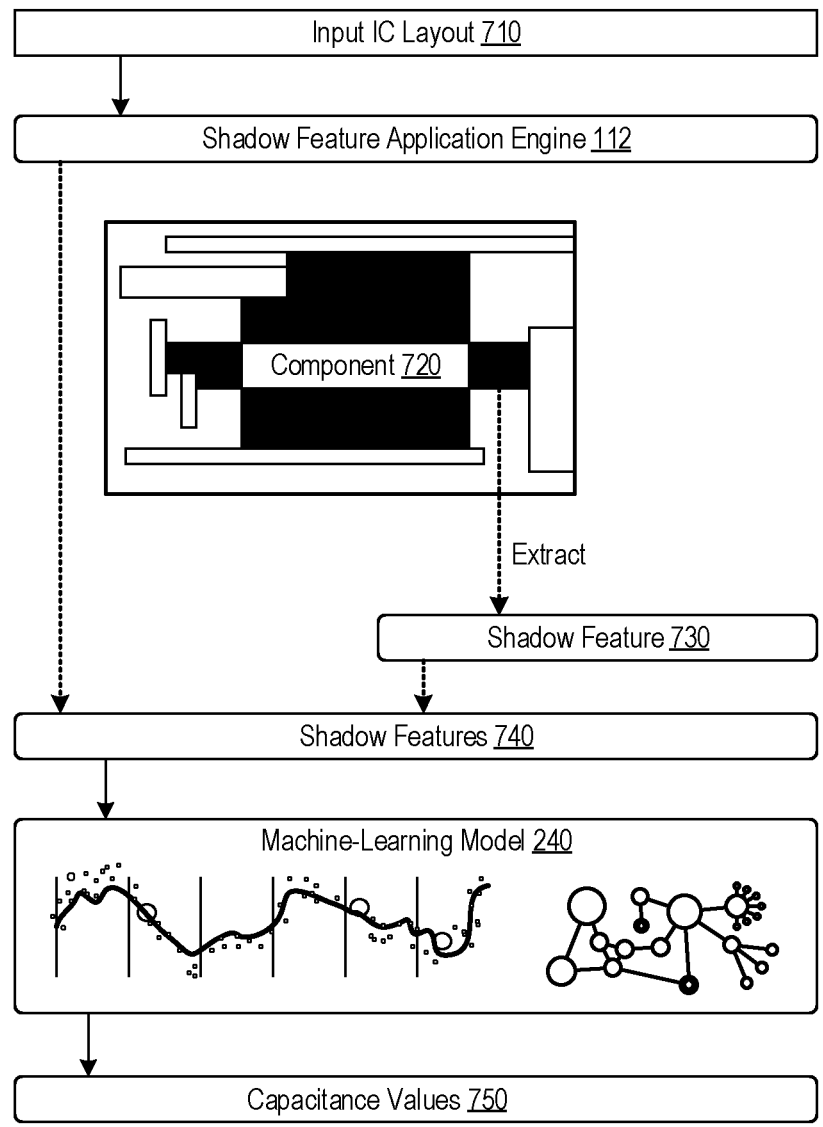
FIG. 7 shows an example of a shadow feature-based determination of capacitance values for an input IC layout through a trained ML model.

FIG. 7 shows an example of a shadow feature-based determination of capacitance values for an input IC layout through a trained ML model. The shadow feature-based determine of capacitance values of FIG. 7 is described using the shadow feature application engine 112 as an example, by such a shadow feature-based determination may be implemented or performed by any computing system or system component.

In the example of FIG. 7, the shadow feature application engine 112 access an input IC layout 710. The input IC layout 710 may include any type circuit design, such as a physical layout of a circuit being designed through an EDA application. The shadow feature application engine 112 may extract shadow features from the input IC layout 710 to provide as an input to a ML model trained with shadow feature training data. To do so, the shadow feature application engine 112 may extract shadow features from the input IC layout 710 on a per-component basis. As an illustrative example, FIG. 7 depicts a component 720 of the input IC layout 710. The shadow feature application engine 112 may extract a shadow feature 730 specifically for the component 720, and extraction of the shadow feature 730 may be in a consistent format, process, or flow as was used to generate shadow feature training data to train the ML model 240.

In that regard, the shadow feature application engine 112 may extract shadow features from individual components the input IC layout 710 in any of the ways described herein. For instance, the shadow feature application engine 112 may extract a same-layer shadow feature value, a different-layer shadow feature value, and a ground-layer shadow feature value for the component 720, doing so by identifying surrounding components, determining shadow spaces, and computing (and aggregating) individually-determined shadow space values to extract a discrete, unitless, and scalar value for each of the same-layer shadow feature value, the different-layer shadow feature value, and the ground-layer shadow feature value respectively. In a similar manner, the shadow feature application engine 112 may extract non-linear shadow features as well, such as a same-layer non-linear shadow feature value, a different-layer non-linear shadow feature value, and a ground-layer non-linear shadow feature value, each of which be discrete, unitless, and scalar as well.

In FIG. 7, the shadow feature application engine 112 extracts the shadow features 740 from the input IC layout 710, which the shadow feature application engine 112 may provide as an input to the ML model 240. Trained with shadow feature training data, the ML model 240 may output capacitance values 750 for the IC layout components from which the shadow features 740 were extracted. The shadow feature application engine 112 may thus apply any of the shadow feature extraction techniques described herein and utilize a trained ML model to determine capacitance values for components of the input IC layout 710.

Many aspects of the shadow feature technology described herein have been presented through illustrative examples included in various figures. The shadow feature model training engine 110, the shadow feature application engine 112, or a combination of both, may implement any combination of any aspect of the shadow feature technology described herein.

Figure 8:
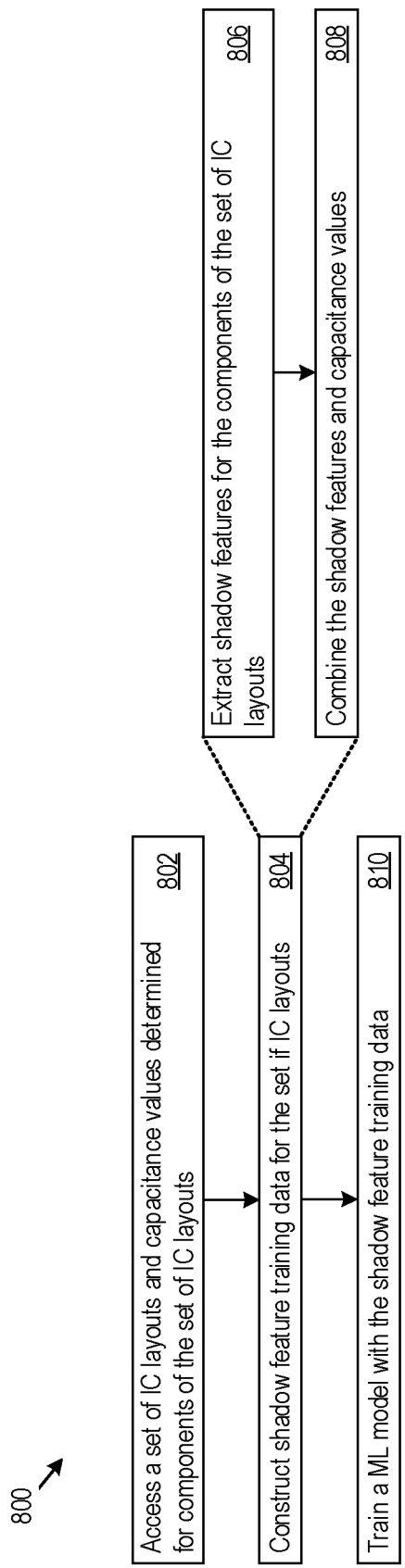
FIG. 8 shows an example of logic that a system may implement to support shadow feature-based training of an ML model.

FIG. 8 shows an example of logic 800 that a system may implement to support shadow feature-based training of an ML model. For example, the computing system 100 may implement the logic 800 as hardware, executable instructions stored on a machine-readable medium, or as a combination of both. The computing system 100 may implement the logic 800 via the shadow feature model training engine 110, through which the computing system 100 may perform or execute the logic 800 as a method. The following description of the logic 800 is provided using the shadow feature model training engine 110 as an example. However, other implementation options by computing systems are possible.

In implementing the logic 800, the shadow feature model training engine 110 may access a set of IC layouts and capacitance values determined for components of the set of IC layouts (802). The shadow feature model training engine 110 may then construct shadow feature training data for the set of IC layouts (804), including by extracting shadow features components of the set of IC layouts (806) and combining the shadow features and capacitance values (808). The shadow feature model training engine 110 may do so in any of the ways described herein, and extracted shadow features may include unitless, scalar values computed from space areas and distances between IC layout components to unobstructed portions of surrounding components. In implementing the logic, the shadow feature model training engine 110 may also train an ML model with the shadow feature training data (810).

The logic 800 shown in FIG. 8 provides an illustrative example by which a computing system 100 may support shadow feature-based determination of capacitance values for IC layouts according to the present disclosure. Additional or alternative steps in the logic 800 are contemplated herein, including according to any of the various features described herein for the shadow feature model training engine 110, the shadow feature application engine 112, and any combinations thereof.

Figure 9:
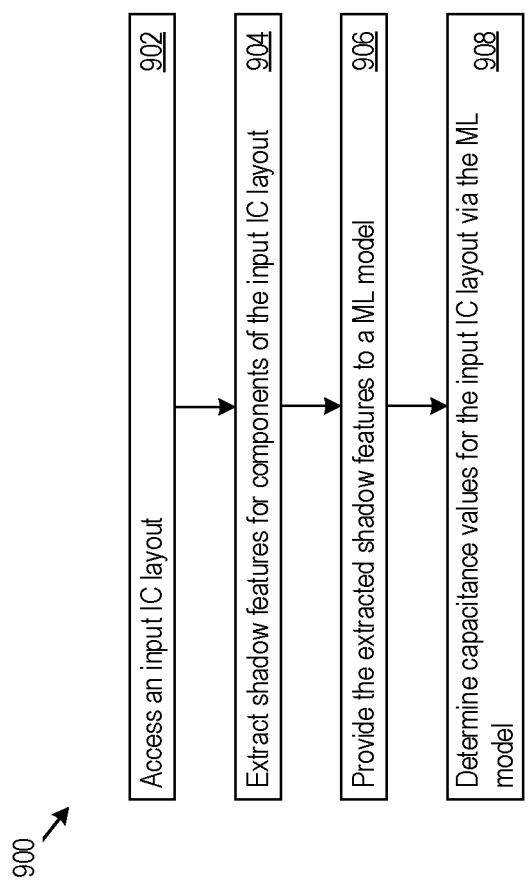
FIG. 9 shows an example of logic that a system may implement to support shadow feature-based capacitance value determinations via a trained ML model.

FIG. 9 shows an example of logic 900 that a system may implement to support shadow feature-based capacitance value determinations via a trained ML model. For example, the computing system 100 may implement the logic 900 as hardware, executable instructions stored on a machine-readable medium, or as a combination of both. The computing system 100 may implement the logic 900 via the shadow feature application engine 112, through which the computing system 100 may perform or execute the logic 900 as a method. The following description of the logic 900 is provided using the shadow feature application engine 110 as an example. However, other implementation options by computing systems are possible.

In implementing the logic 900, the shadow feature application engine 112 may access an input IC layout (902) and extract shadow features for components of the input IC layout (904), doing so in any of the ways described herein. The shadow feature application engine 112 may further provide the extracted shadow features for the components of the input IC layout to an ML model (906) and determine capacitance values for the input IC layout via the ML model (908).

The logic 900 shown in FIG. 9 provides an illustrative example by which a computing system 100 may support shadow feature-based determination of capacitance values for IC layouts according to the present disclosure. Additional or alternative steps in the logic 900 are contemplated herein, including according to any of the various features described herein for the shadow feature model training engine 110, the shadow feature application engine 112, and any combinations thereof.

Figure 10:
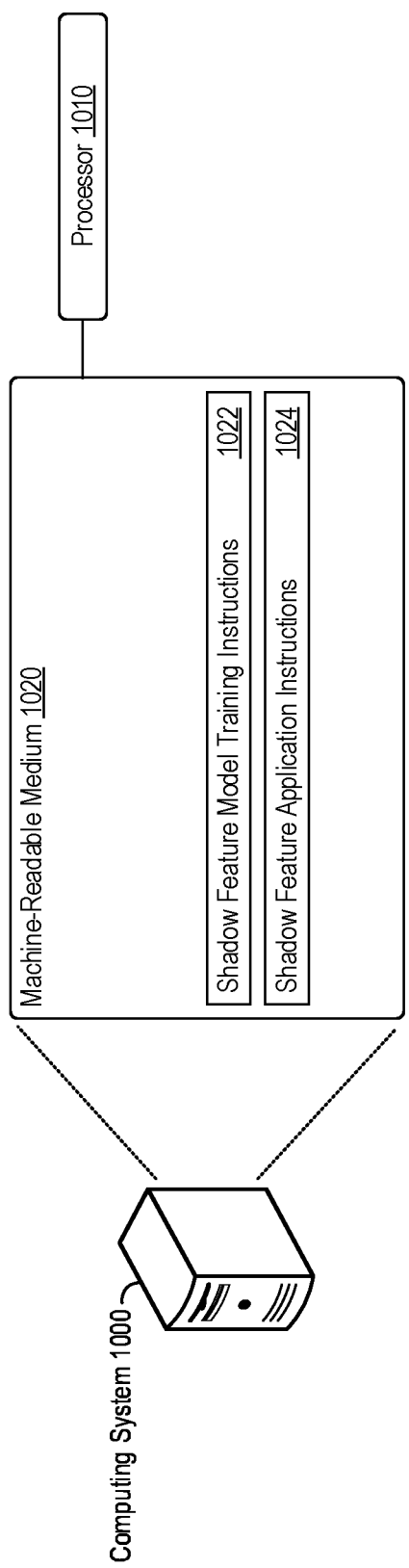
FIG. 10 shows an example of a computing system that supports shadow feature-based determination of capacitance values for IC layouts.

FIG. 10 shows an example of a computing system 1000 that supports shadow feature-based determination of capacitance values for IC layouts. The computing system 1000 may include a processor 1010, which may take the form of a single or multiple processors. The processor(s) 1010 may include a central processing unit (CPU), microprocessor, or any hardware device suitable for executing instructions stored on a machine-readable medium. The computing system 1000 may include a machine-readable medium 1020. The machine-readable medium 1020 may take the form of any non-transitory electronic, magnetic, optical, or other physical storage device that stores executable instructions, such as the shadow feature model training instructions 1022 and the shadow feature application instructions 1024 shown in FIG. 10. As such, the machine-readable medium 1020 may be, for example, Random Access Memory (RAM) such as a dynamic RAM (DRAM), flash memory, spin-transfer torque memory, an Electrically-Erasable Programmable Read-Only Memory (EEPROM), a storage drive, an optical disk, and the like.

The computing system 1000 may execute instructions stored on the machine-readable medium 1020 through the processor 1010. Executing the instructions (e.g., the shadow feature model training instructions 1022 and/or the shadow feature application instructions 1024) may cause the computing system 1000 to perform any of the shadow feature technology described herein, including according to any aspect of the shadow feature model training engine 110, the shadow feature application engine 112, or combinations of both.

For example, execution of the shadow feature model training instructions 1022 by the processor 1010 may cause the computing system 1000 to access a set of IC layouts and capacitance values determined for components of the set of IC layouts and construct shadow feature training data for the set of IC layouts. For a given component of an IC layout in the set of IC layouts, execution of the shadow feature model training instructions 1022 may cause the computing system 1000 to extract a shadow feature for the given component as well as combine the shadow feature and a capacitance value for the given component into a shadow feature training data sample of the shadow feature training data. Execution of the shadow feature model training instructions 1022 may further cause the computing system 1000 to train an ML model with the shadow feature training data.

Execution of the shadow feature application instructions 1024 by the processor 1010 may cause the computing system 1000 to access an input IC layout, extract shadow features for components of the input IC layout, provide the extracted shadow features for the components of the input IC layout to an ML model trained with extracted shadow features and capacitance values from other IC layouts, and determine capacitance values for the input IC layout via the ML model.

Any additional or alternative aspects of the shadow feature technology as described herein may be implemented via the shadow feature model training instructions 1022, the shadow feature application instructions 1024, or a combination of both.

The systems, methods, devices, and logic described above, including the shadow feature model training engine 110 and the shadow feature application engine 112, may be implemented in many different ways in many different combinations of hardware, logic, circuitry, and executable instructions stored on a machine-readable medium. For example, the shadow feature model training engine 110, the shadow feature application engine 112, or combinations thereof, may include circuitry in a controller, a microprocessor, or an application specific integrated circuit (ASIC), or may be implemented with discrete logic or components, or a combination of other types of analog or digital circuitry, combined on a single integrated circuit or distributed among multiple integrated circuits. A product, such as a computer program product, may include a storage medium and machine-readable instructions stored on the medium, which when executed in an endpoint, computer system, or other device, cause the device to perform operations according to any of the description above, including according to any features of the shadow feature model training engine 110, the shadow feature application engine 112, or combinations thereof.

The processing capability of the systems, devices, and engines described herein, including the shadow feature model training engine 110 and the shadow feature application engine 112, may be distributed among multiple system components, such as among multiple processors and memories, optionally including multiple distributed processing systems or cloud/network elements. Parameters, databases, and other data structures may be separately stored and managed, may be incorporated into a single memory or database, may be logically and physically organized in many different ways, and may be implemented in many ways, including data structures such as linked lists, hash tables, or implicit storage mechanisms. Programs may be parts (e.g., subroutines) of a single program, separate programs, distributed across several memories and processors, or implemented in many different ways, such as in a library (e.g., a shared library).

While various examples have been described above, many more implementations are possible.

The invention claimed is:

1. A method comprising:
   by a computing system:
   accessing a set of integrated circuit (IC) layouts and capacitance values determined for components of the set of IC layouts;
   constructing shadow feature training data for the set of IC layouts, including by, for a given component of an IC layout in the set of IC layouts:
   extracting a shadow feature for the given component, wherein the shadow feature comprises a unitless, scalar value computed as a function of space areas and distances between the given component to unobstructed portions of surrounding components of the IC layout, wherein the unobstructed portions are not blocked along a linear view to the given component by any other component of the IC layout; and
   combining the shadow feature and a capacitance value for the given component into a shadow feature training data sample of the shadow feature training data;
   training a machine-learning (ML) model with the shadow feature training data;
   accessing an input IC layout; and
   extracting shadow features for components of the input IC layout;
   providing the extracted shadow features for the components of the input IC layout to the trained ML model; and
   determining capacitance values for the input IC layout via the trained ML model.

2. The method of claim 1, wherein extracting the shadow feature for the given component of the IC layout comprises determining a same-layer shadow feature value of the shadow feature, including by:
   determining space areas and distances between the given component and unobstructed portions of same-layer surrounding components of the IC layout, wherein the same-layer surrounding components are positioned on a same layer as the given component; and
   computing the same-layer shadow feature value as a function of the determined space areas and the distances between the given component and the unobstructed portions of the same-layer surrounding components.

3. The method of claim 1, wherein extracting the shadow feature for the given component of the IC layout comprises determining a different-layer shadow feature value of the shadow feature, including by:
   determining space areas and distances between the given component and unobstructed portions of different-layer surrounding components of the IC layout, wherein the different-layer surrounding components are positioned on a different layer of the IC layout from the given component; and
   computing the different-layer shadow feature value as a function of the determined space areas and the distances between the given component and the unobstructed portions of the different-layer surrounding components.

4. The method of claim 1, wherein extracting the shadow feature for the given component of the IC layout comprises determining a ground-layer shadow feature value of the shadow feature, including by:
   determining space areas and distances between the given component and unobstructed portions of a ground layer of the IC layout; and
   computing the ground-layer shadow feature value as a function of the determined space areas and the distances between the given component and the unobstructed portions of the ground layer of the IC layout.

5. The method of claim 1, wherein the shadow feature of the given component comprises a same-layer shadow feature value, a different-layer shadow feature value, and a ground-layer shadow feature value, and
   wherein each of the same-layer shadow feature value, the different-layer shadow feature value, and the ground-layer shadow feature value are extracted and represented as a distinct unitless, scalar value.

6. The method of claim 1, wherein extracting the shadow feature for the given component comprises determining the unobstructed portions of the surrounding components of the IC layout, including by:
   identifying the surrounding components as components of the IC layout within a search area for the given component;
   representing the surrounding components within the search area as edges of the surrounding components that are closest in distance to the given component; and
   determining, as the unobstructed portions, edge portions that are not blocked along a linear view to the given component by any other edges.

7. The method of claim 1, wherein the components of the set of IC layouts, the components of input IC layout, or both, are nets of an IC design or polygons of a physical layout.

8. A non-transitory machine-readable medium comprising instructions that, when executed by a processor, cause a computing system to:
   access an input integrated circuit (IC) layout;
   extract shadow features for components of the input IC layout, wherein each shadow feature comprises a unitless, scalar value computed as a function of space areas and distances between a given component of the input IC layout to unobstructed portions of surrounding components of the IC layout, wherein the unobstructed portions are not blocked along a linear view to the given component by any other component of the input IC layout; and
   provide the extracted shadow features for the components of the input IC layout to a machine-learning (ML) model, the ML model trained with extracted shadow features and capacitance values from other IC layouts; and
   determine capacitance values for the input IC layout via the ML model.

9. The non-transitory machine-readable medium of claim 8, wherein the instructions cause the computing system to extract the shadow feature for the given component of the input IC layout by determining a same-layer shadow feature value of the shadow feature, including by:
   determining space areas and distances between the given component and unobstructed portions of same-layer surrounding components of the input IC layout, wherein the same-layer surrounding components are positioned on a same layer as the given component; and computing the same-layer shadow feature value as a function of the determined space areas and the distances between the given component and the unobstructed portions of the same-layer surrounding components.

10. The non-transitory machine-readable medium of claim 8, wherein the instructions cause the computing system to extract the shadow feature for the given component of the input IC layout by determining a different-layer shadow feature value of the shadow feature, including by:

determining space areas and distances between the given component and unobstructed portions of different-layer surrounding components of the input IC layout, wherein the different-layer surrounding components are positioned on a different layer of the IC layout from the given component; and computing the different-layer shadow feature value as a function of the determined space areas and the distances between the given component and the unobstructed portions of the different-layer surrounding components.

11. The non-transitory machine-readable medium of claim 8, wherein the instructions cause the computing system to extract the shadow feature for the given component of the input IC layout by determining a ground-layer shadow feature value of the shadow feature, including by:

determining space areas and distances between the given component and unobstructed portions of a ground layer of the input IC layout; and computing the ground-layer shadow feature value as a function of the determined space areas and the distances between the given component and the unobstructed portions of the ground layer of the input IC layout.

12. The non-transitory machine-readable medium of claim 8, wherein each shadow feature of the components of the input IC layout comprises a same-layer shadow feature value, a different-layer shadow feature value, and a ground-layer shadow feature value, and wherein each of the same-layer shadow feature value, the different-layer shadow feature value, and the ground-layer shadow feature value are extracted and represented as a distinct unitless, scalar value.

13. The non-transitory machine-readable medium of claim 8, wherein the instructions cause the computing system to extract the shadow feature for the given component by determining the unobstructed portions of the surrounding components of the input IC layout, including by:

identifying the surrounding components as components of the IC layout within a search area for the given component;

representing the surrounding components within the search area as edges of the surrounding components that are closest in distance to the given component; and determining, as the unobstructed portions, edge portions that are not blocked along a linear view to the given component by any other edges.

\* \* \* \* \*